United States Patent [19]

Tihanyi et al.

[11] 4,190,850

[45] Feb. 26, 1980

[54] MIS FIELD EFFECT TRANSISTOR HAVING A SHORT CHANNEL LENGTH

[75] Inventors: Jenöe Tihanyi, Munich; Guido Bell, Gilching, both of Fed. Rep. of Germany

[73] Assignee: Siemens Aktiengesellschaft, Berlin & Munich, Fed. Rep. of Germany

[21] Appl. No.: 870,216

[22] Filed: Jan. 17, 1978

[30] Foreign Application Priority Data

Jan. 31, 1977 [DE] Fed. Rep. of Germany ....... 2703877

[51] Int. Cl.² .............................................. H01L 29/78
[52] U.S. Cl. ....................................... 357/23; 357/20; 357/54; 357/91
[58] Field of Search ................ 357/20, 23, 91, 54, 357/59

[56] References Cited

U.S. PATENT DOCUMENTS

| | | | |
|---|---|---|---|
| 3,436,620 | 4/1969 | Diemer et al. | 357/23 |
| 3,604,990 | 9/1971 | Sigsbee | 357/23 |
| 3,653,978 | 4/1972 | Robinson et al. | 357/23 |
| 3,846,822 | 11/1974 | Riley et al. | 357/23 |
| 3,950,777 | 4/1976 | Tarui et al. | 357/23 |
| 4,115,794 | 9/1978 | De La Moneda | 357/20 |
| 4,143,388 | 3/1979 | Esaki et al. | 357/91 |

OTHER PUBLICATIONS

J. Verwey et al., "Atmos-An Elect. Reprogram. Read-Only Mem. Dev., " IEEE Trans. On Elec. Dev., vol. Ed-21, #10, Oct. 1974, pp. 631-635.

*Primary Examiner*—Joseph E. Clawson, Jr.
*Attorney, Agent, or Firm*—Hill, Van Santen, Steadman, Chiara & Simpson

[57] ABSTRACT

A MIS field effect transistor having a source zone of a first impurity type formed in a semiconductor substrate immediately below one planar surface thereof, a drain zone of the first conductivity type in said substrate spaced from the source zone immediately below said one surface, a third zone, of said first impurity type in said substrate extending between said source and drain zones and extending deeper in said substrate than either said source or drain zones, a thin buried zone of the second conductivity type in said substrate spaced below and around the ends of said source zone, the region of said buried zone where it lies between said source and drain zones providing a channel whose length is only the thickness of the buried zone in the region where the buried zone reaches the substrate surface. A process for producing such a transistor is also disclosed.

18 Claims, 10 Drawing Figures

MIS FIELD EFFECT TRANSISTOR HAVING A SHORT CHANNEL LENGTH

BACKGROUND OF THE INVENTION

There are many requirements for a high switching speed in MIS field effect transistors, and for this reason, the industry has endeavored to keep the channel length between the source zone and drain zone very small. One effort to accomplish this result is the "VMOS TRANSISTOR" ("Electronic Design", Vol. 21, Oct. 11, 1975, Circle No. 307). Another example is the "double diffused" MIS field effect transistor. In the double diffused MIS field effect transistor, a short channel is produced in that dopant of a first conductivity type is diffused into the semiconductor body through a mask opening. As a result of under-diffusion, the doping material in the semiconductor body also laterally extends beyond the boundaries of the mask openings. Then, in a second doping step, doping material of the second conductivity type is diffused through the same mask opening. By virtue of the selection of the diffusion temperature and the diffusion time, in this second process step it is ensured that the lateral diffusion under the edge of the mask is less than for the doping material which was diffused in during the first process step. The two doped zones meet the substrate surface at different points. That part of the semiconductor substrate lying between these points represents the channel. Channel lengths of down to approximately 1.5 $\mu$m can be achieved with this process. With this double diffusion process, it is not possible to achieve shorter channel lengths with adequate reproducibility, as when dopant is introduced by means of diffusion, the doping profile continuously widens so that this in itself imposes a lower limit on the attainable channel length. Furthermore, the diffusion is heavily temperature-dependent so that even slight temperature changes exert a disadvantageous influence upon the reproducibility of this process.

BRIEF SUMMARY OF THE INVENTION

An object of the present invention is to provide a MIS field effect transistor by which the channel length can be reduced to approximately 0.1 $\mu$m, and as a result, the switching speed and high frequency characteristics of such a transistor can be improved.

The present invention is based upon the fact that with doping by means of ion implantation, the dimensions of the doped zones produced in a semiconductor substrate can be determined considerably more accurately by the structure provided by the implantation mask. Furthermore, the penetration depth of the implanted ions can be very accurately determined by the selection of the relevant implantation energy, so that implanted zones can be arranged very close to one another in the semiconductor substrate both in the lateral and the vertical directions.

The production of the source zone and of the second doped zone of the opposite conductivity type which surrounds the source zone can fundamentally be carried out with two implantation masks, where the implantation mask employed for the second doped zone possesses a somewhat larger window than the implantation mask employed for the source zone. However, as it is generally difficult to adjust to implantation masks with sufficient accuracy, in accordance with a special development of the invention, a structure as described in sub-Claims 3 and 5 is preferred. This structure has particular advantages for the production process of this transistor. The wedge-shaped course of the gate insulating layer and of the gate electrode layer over the channel zone facilitates a "self-adjusting" production of the source zone and of the surrounding second, doped zone, in which the gate insulating layer or gate electrode layer is used as implantation mask. The implantation of the second doped zone here is carried out with an energy which is such that the implanted ions, in accordance with the increase in thickness of the gate insulating layer or gate electrode layer, penetrate less far into the semiconductor substrate, and that in this way it is ensured that the concentration maximum of the ions implanted in order to form the second doped zone passes through the surface of the semiconductor substrate at a short distance beside the edge of the source zone. The size of the wedge angle can determine the size of the distance between this pass line and the edge of the source zone. This distance is in fact the length of the channel effective for the MIS transistor. First, the increase in thickness of the gate insulating layer produced by the wedge, not only has a favorable influence upon the production process, but also the advantage that the gate electrode applied to this insulating layer is arranged only in the direct vicinity of the channel, close to the surface of the semiconductor substrate, so that in this way, the gate drain capacitance is reduced. This has further favorable influences upon the high voltage stability of such a transistor. Instead of a wedge-shaped gate oxide, a gate electrode layer which rises in a wedge shape, e.g., a polysilicon layer can be used as implantation mask for the production of the short channel. With a gate electrode of this kind, provided with a polysilicon layer, the high voltage stability can likewise be raised by increasing the thickness of the gate insulating layer in the area between the source terminal and the drain electrode.

Preferably, a MIS field effect transistor in accordance with the invention is designed in the n-channel technique, as in this case the mobility of the charge carriers in the channel zone is greater than with the p-channel technique, producing a gradient which is greater by approximately the factor 3. Furthermore, when the implantation technique is employed with silicon, it is more easily possible to implant p-dopant particles such as boron into deeper layers of the semiconductor than n-dopant particles, such as, e.g., phosphorus.

In another embodiment of the invention, the MIS field effect transistor is constructed in a ESFI technique, for which purpose a thin, n-conducting silicon film is applied to a sapphire monocrystal. The active zones of the transistor are then arranged in this silicon film.

In the following the MIS field effect transistor in accordance with the invention and the process for the production thereof will be described and explained in detail making reference to the preferred exemplary embodiments illustrated in the Figures.

BRIEF DESCRIPTION OF THE DRAWINGS

FIG. 4 illustrates the resulting MIS field effect transistor;

DESCRIPTION OF PREFERRED EMBODIMENTS

Figure 1:
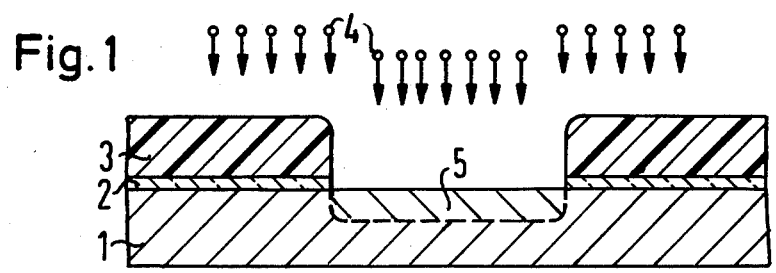
FIGS. 1 to 4 schematically show the production process for constructing a MIS field effect transistor in accordance with the invention.
Figure 2:
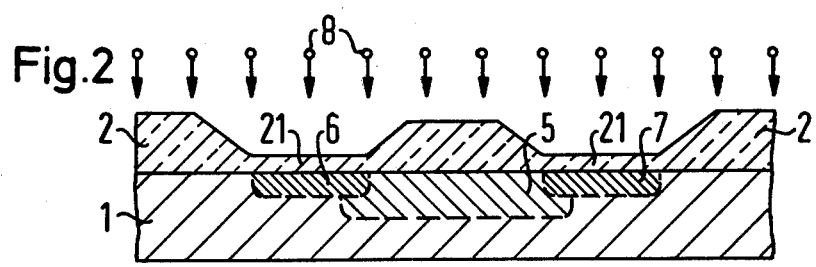
Figure 3:
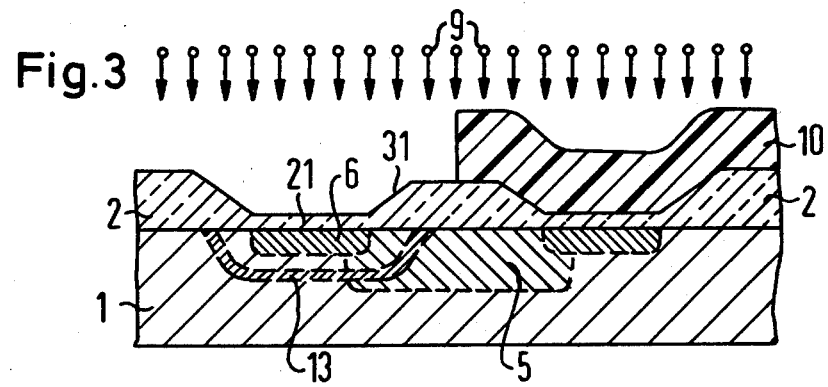

In order to produce a field effect transistor in accordance with the invention with gate oxide rising in a wedge shape on a semiconductor substrate, for example, a silicon substrate 1, there is deposited a gate insulating layer 2 which has a thickness of between approximately 0.05 and 0.2 $\mu$m and which consists, for example, of silicon dioxide or silicon nitride. Using a photolithographic process, a window is etched into the gate insulating layer, and is located above that part of the semiconductor substrate provided for the third doped zone 5. Then ions 4 of the first conductivity type, for example, phosphorus ions, are implanted through this window into the semiconductor. The implantation energy amounts, for example, to 100 keV. The implantation dose is selected to be such that the charge carrier concentration in the third doped zone 5 amounts to approximately $10^{16}$ per cm$^3$. Here the implantation mask consists of the photo-lacquer layer 3 which has also been used for the production of the window contained in the insulating layer 2. Then the photo-lacquer layer 3 is removed, and on the semiconductor substrate there is firstly deposited an insulating layer having a thickness of a few $\mu$m, for example, by oxidation in the presence of oxygen, where the insulating layer consists of silicon dioxide. Then, employing a photolithographic technique, the insulating layer 2 is removed above those zones of the semiconductor substrate provided for the source zone 6, the drain zone 7 and the channel zone 12 of the MIS field effect transistor, except for a thin layer 21 having a thickness of approximately 0.05 to 0.2 $\mu$m. In this process, it is ensured that at the edge of the thin layer zones 21 produced in this way, the thickness of the insulating layer rises in a wedge shape. A reproducible angle of slope for the wedge-shaped gradient 31 can be achieved in various ways.

On the other hand, the insulating layer can be removed by using an ion etching process, in which employing a mask, the insulating layer is sputtered off by ion bombardment. In this case, the insulating layer is provided with an etching mask which leaves exposed the thin layer zone 21 of the insulating layer which are to be produced. The material used for the mask is one which is itself removed during the sputtering. During the sputtering, the edge profile of the etching mask is transferred into the insulating layer which is to be etched away. As the etching mask is itself attached during the sputtering, and its edges become bevelled in the region of the opening, the recesses produced in the insulating layer during the sputtering are defined not by surfaces running at right angles to the surface of the semiconductor substrate, but by surfaces which exhibit a wedge angle of up to approximately 60°. A photo-lacquer mask is a suitable etching mask for this type of procedure.

An insulating layer having a wedge-like thickness profile can also be produced in that on the semiconductor there is deposited for example a SiO$_2$ layer, and thereupon a phosphorus glass layer. If an opening or recess is etched into a double layer of this kind with hydrofluoric acid, the opening or recess obtains obliquely rising boundary flanks, as the phosphorus glass layer is attacked to a greater extent by the etching agent than the underlying SiO$_2$ layer. Following the etching, the phosphorus glass layer can be rounded off by fusion.

Another way of producing an insulating layer having a wedge-like thickness profile consists in bombarding the entire surface of the insulating layer 2 with ions and subsequently effecting a wet chemical etching or plasma etching employing an etching mask. The thin surface zones of the insulating layer which are exposed to the ion beam exhibit a higher removal rate during the wet chemical etching or plasma etching than the deeper zones of the insulating layer which are not exposed to the ion beam. The slope of the insulating layer which results from the different etching rates rises in a wedge-like fashion.

The above described, various methods for the production of an insulating layer having a thickness profile which rises in wedge shape are easily reproducible.

Now that the insulating layer has been provided with a profile in the manner described, a further ion implantation step is carried out, in which ions 8 of the first conductivity type, for example, phosphorus ions are planted through the insulating thin layer 21 into the semiconductor. The acceleration voltage of these ions, for example, phosphorus ions, is selected to be such that they only pass through the thin layer zones 21 of the insulating layer and penetrate into the semiconductor in order to form doped source zone 6 and drain zone 7. In this implantation step, the implantation dose is selected to be such that the source zone 6 and the drain zone 7 achieve a dopant concentration of approximately $10^{19}$ to $10^{20}$ charge carriers per cm$^3$. Here the position of the wedge-like thickness gradient 31 of the insulating layer ensures that the source zone 6 and the drain zone 7 extend into the third doped zone 5 which possesses the same conductivity type. Following this implantation step, the drain zone 7 is covered with a photo-lacquer layer 10. This photolacquer layer serves as a mask for the following implantation of dopant particles 9 of the second conductivity type, for example, boron ions. In this implantation, the implantation energy is selected to be such that the average penetration depth of the boron ions 9 amounts to approximately 0.4 $\mu$m, and thus the second zone 13 doped with these ions runs beneath the source zone 6. In order to achieve such a penetration depth, the acceleration voltage for boron ions should be selected to be approximately 100 keV. The boron ions which must pass through the wedge-shaped gradient 31 of the insulating layer 2, in order to reach the semiconductor body, here are decelerated so that beneath this wedge-shaped gradient 31, the second strongly doped zone 13 is deflected at the top and reaches the semiconductor surface. Following this implantation doping, the photo-lacquer mask 10 is removed, and electrode contacts are produced in that contact holes are etched into the insulating layer 2 above the source zone and above the drain zone. Then contact conductor paths 16, 17 are brought to the source zone 6 and drain zone 7, and a gate electrode 15 is deposited on the insulating layer 2 in the region lying above the channel zone 12.

Figure 4:
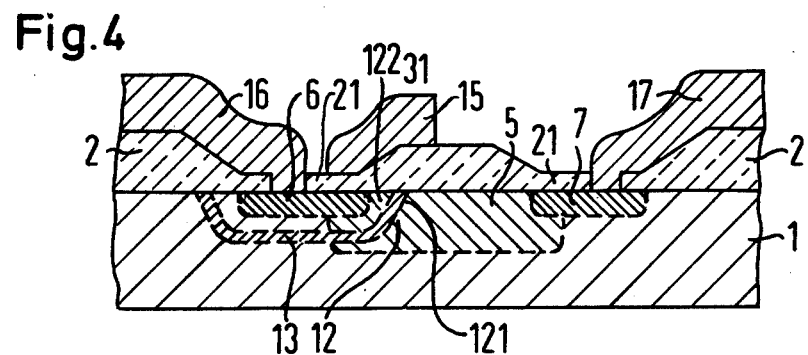

This channel zone 12 is located between the outer edge of the source zone 6 and the outer edge of the second doped zone 13. The final structure of the MIS field effect transistor is shown in FIG. 4. With low drain currents, the effective channel zone is more or less governed by the width of the zone 21 in which the second doped zone 13 meets the surface of the semiconductor body. With higher drain currents, the zone 122 of the semiconductor body lying between the outer edge of this second doped zone 13 and the outer edge of the source zone 6 also acts as current channel so that in this case the channel length of the MIS field effect transistor is somewhat greater. The channel length thus amounts to between approximately 0.1 $\mu$m to approximately 0.5 $\mu$m in dependence upon the strength of the drain current. The thickness of the insulating layer 2 in the part rising in wedge shape above the end of the channel amounts to 0.1 to 0.2 $\mu$m. With increasing distance from the channel zone 12, the thickness of the insulating layer then increases further. The distance between the source zone 6 and the drain zone 7 amounts to between 1 and 10 $\mu$m, as with greater distances between source and drain zone, the series resistance of the MIS field effect transistor increases.

Figure 5:
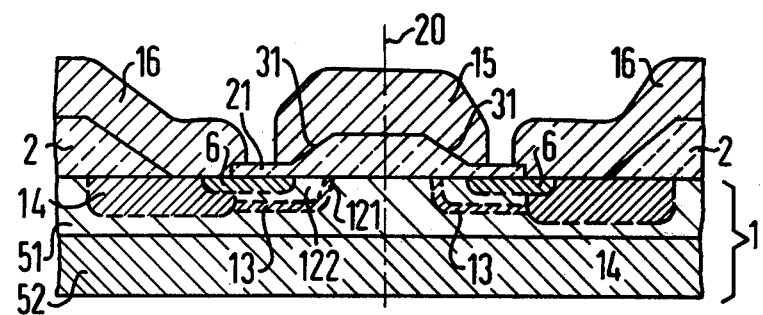
FIG. 5 illustrates another preferred embodiment of the present invention, in which the drain electrode will be described as a buried layer.

FIG. 5 illustrates another embodiment of a MIS field effect transistor in accordance with the invention, in which the drain electrode is designed as so-called buried drain. In this embodiment, the semiconductor substrate 1 consists of a heavily doped layer of the first conductivity type, for example, a silicon layer 52 strongly doped with phosphorus. The charge carrier concentration in thus buried drain amounts for example to $10^{19}$ to $10^{20}$ charge carriers per cm$^3$. On this strongly doped layer of the first conductivity type there is arranged a second layer 51 which possesses the same conductivity type as the first heavily doped layer 52, but is more weakly doped. This layer 51 possesses a doping strength of approximately $10^{17}$ charge carriers per cm$^3$. In this layer 51 is arranged a further, strongly doped zone 14 of the second conductivity type which lies laterally to the source zone 6 and into which the second doped zone 13 extends or passes. In this embodiment (FIG. 5), the contact conductor path 16 is arranged in such a way that it provides a supply line both to the further, strongly doped zone 14 and to the source zone 6.

The production of the further, strongly doped zone 14 is expediently carried out at the beginning of the production process by ion implantation or by diffusing in the dopant. Otherwise the production process is in accordance with the already described process, with the difference, however, that in the contact hole etching for the contact to the source zone 6, the further, strongly doped zone 14 is exposed and is subsequently contacted.

With this transistor, the current flow takes place from the source zone 6 across the channel zone 121 and via the layer 51 to the drain electrode 52. A field effect transistor of this type can be arranged to be symmetrical or rotation-symmetrical to a plane or axis of symmetry 20.

Figure 6:
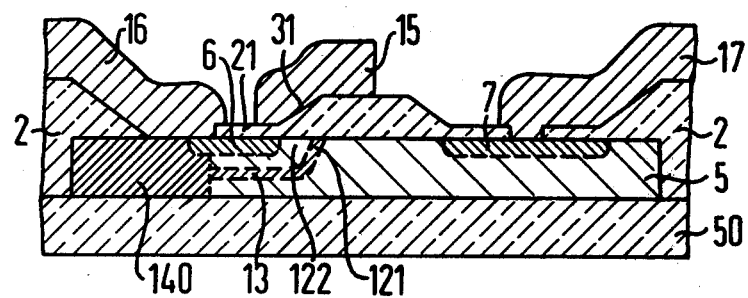
FIG. 6 illustrates a MIS field effect transistor of the present invention constructed on an insulating substrate.
Figure 7:
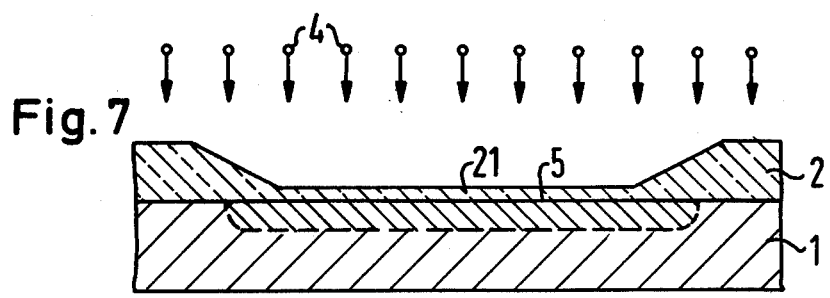
FIGS. 7 to 10 schematically illustrate the production process for a MIS field effect transistor in accordance with the invention with a gate electrode layer composed of polycrystalline silicon, where this gate electrode layer rises in wedge shape over the channel zone of the field effect transistor, the structure of the finished component being shown in FIG. 10.
Figure 8:
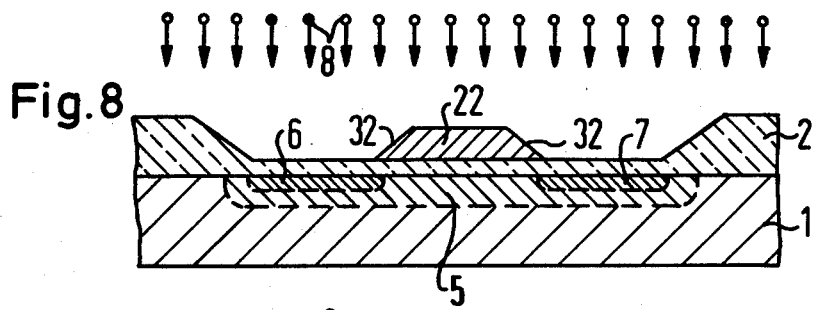
Figure 9:
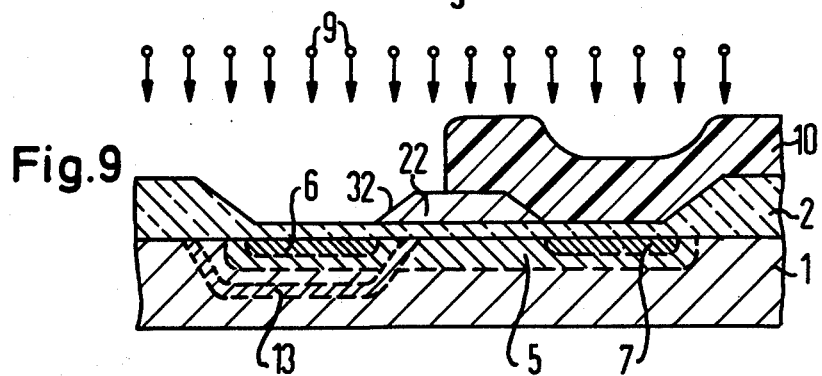
Figure 10:
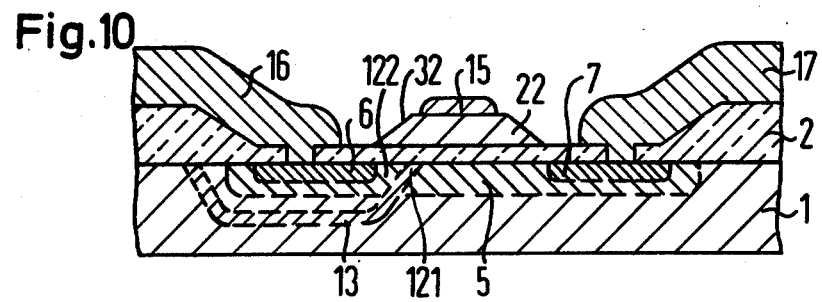

Another arrangement suitable for production in the epitaxial silicon film technique on an insulating substrate is illustrated in FIG. 6, where an epitaxial silicon layer 53, doped for example to be n-conducting with a dopant concentration of $10^{16}$ charge carriers cm$^3$ is deposited on an insulating carrier, for example, a sapphire wafer 50. In the epitaxial silicon layer 53, for example by ion implantation or by diffusion, in accordance with the embodiment in FIG. 5, there is produced a further, strongly doped zone 140 of the second conductivity type which is contacted with the contact conductor path 16, and passes into the second, strongly doped zone 13 produced by ion implantation. The production of the source zone 6 and the drain zone 7, and of the second doped zone 13, and likewise the production of the insulating layer 2, 21 is carried out in the manner already described.

FIGS. 7 to 10 schematically illustrate how a further exemplary embodiment of a MIS field effect transistor can be produced. For this purpose, an insulating layer 2 is deposited onto a weakly p-conducting silicon substrate which possesses a charge carrier concentration of approximately $10^{14}$ to $10^{15}$ cm$^{-3}$. Then a sub-zone of this insulating layer 2 is etched away employing a photolithographic process to a thin layer 21 having a thickness of approximately 0.05 to 0.1 $\mu$m. Ions 4 of the first conductivity type, for example, phosphorus ions, are implanted through this thin layer 21 produced by etching. Then a gate electrode layer 22 consisting of polycrystalline silicon is deposited onto this thin insulating layer 21. The deposition can be effected by vapor deposition employing a vapor deposition mask, or by deposition onto the full surface with a subsequent, photolithographic etching process. This gate electrode layer 22 is provided with oblique flanks 32 by sputtering or by wet chemical etching or plasma etching following preliminary ion bombardment. This gate electrode layer 22 represents the implantation mask for a following implantation of ions 8 of the first conductivity type. The second implantation with ions 8 of the first conductivity type is effected with an acceleration voltage and a dose which are such that a strongly doped source zone 6 and a strongly doped drain zone 7 are formed which extend approximately 0.1 $\mu$m beneath the surface of the semiconductor 1. Following this implantation, in the manner already described above, the drain zone 7 is covered with a photo-lacquer mask 10 and a third implantation is carried out with ions 9 of the second conductivity type, for example, with boron ions. In this third implantation step, the acceleration voltage and the dose are selected to be such that a second doped zone 13 is formed which runs beneath the source zone 6 and meets the surface of the semiconductor body beneath the wedge-shaped gradient 32 of the polysilicon electrode 22. When this has been effected, the photo-lacquer mask 10 is removed and contact holes are etched to the source zone and drain zone, whereupon conductor path terminals 16 to the source electrode, a terminal 17 to the drain electrode, and a terminal 15 composed of metal to the polysilicon electrode 22 are applied. In order to reduce the conductivity resistance of the gate electrode 22, it is expedient to provide the whole surface of the gate electrode 22 with a metal supply line 15 of this kind. When the MIS transistor is of the n-channel type, the polysilicon gate electrode can additionally be strongly n-doped, whereas in a p-channel design it can be strongly p-doped.

It will be apparent to those skilled in the art that many modifications and variations may be effected without departing from the spirit and scope of the novel concepts of the present invention.

We claim as our invention:

1. MIS field effect transistor having a short channel length with a semiconductor substrate, on the surface of which there is arranged an insulating layer, which is in turn provided with a gate electrode layer, wherein, in the semiconductor substrate there is provided a drain zone of the first conductivity type and a source zone which possesses the first conductivity type is strongly doped and meets the substrate surface, a second doped zone of the second conductivity type which lies below said source zone and surrounds said source zone at least in the direction of said drain zone, and meets the substrate surface spaced laterally with respect to said source zone by a third zone, a channel zone being formed by that portion of the semiconductor substrate which lies between the outer edge of said second doped zone adjoining the substrate surface and the adjacent edge of said source zone, and is located within said third zone of the first conductivity type, said third doped zone being lightly doped and adjoining said drain zone, source zone and said second doped zone containing implanted dopant particles.

2. MIS field effect transistor as claimed in claim 1, in which the length of said channel zone amounts to between 0.1 and 0.5 μm.

3. MIS field effect transistor as claimed in claim 1, in which the thickness of said insulating layer above said channel zone gradually reduces in thickness towards said source zone to thereby form a wedge angle.

4. MIS field effect transistor as claimed in claim 3, in which said wedge angle amounts to between approximately 15° and approximately 60°.

5. MIS field effect transistor as claimed in claim 3, in which said wedge angle amounts to approximately 20°.

6. MIS field effect transistor as claimed in claim 1, in which the thickness of said gate electrode above said channel zone is reduced in a wedge-angle towards its edges.

7. MIS field effect transistor as claimed in claim 6, in which the thickness of said gate electrode layer between said source zone and said drain zone increases continuously in the direction of said drain zone.

8. MIS field effect transistor as claimed in claim 6, in which said wedge angle amounts to between approximately 15° and approximately 60°.

9. MIS field effect transistor as claimed in claim 6, in which said wedge angle amounts to approximately 20°.

10. MIS field effect transistor as claimed in claim 1, in which said drain zone is a buried layer which lies beneath said third doped zone in said semiconductor substrate.

11. MIS field effect transistor as claimed in claim 1, in which said drain zone is located laterally of said third doped zone and meets said surface of said semiconductor substrate.

12. MIS field effect transistor as claimed in claim 1, in which said semiconductor substrate consists of silicon.

13. MIS field effect transistor as claimed in claim 1, said zones of the first conductivity type being doped with n-dopant, and those of the second conductivity type being doped with p-dopant.

14. MIS field effect transistor as claimed in claim 11, in which said n-dopant is phosphorus and said p-dopant is boron.

15. MIS field effect transistor as claimed in claim 1, in which said insulating layer consists of silicon dioxide.

16. MIS field effect transistor as claimed in claim 1, in which said insulating layer is a double layer which consists of a $SiO_2$ layer and a phosphorus glass layer arranged upon it.

17. MIS field effect transistor as claimed in claim 1, in which said gate electrode layer consists of polycrystalline silicon.

18. A field effect transistor having a short channel length comprising a semiconductor substrate, a heavily doped source zone of a first impurity type formed in said semiconductor substrate immediately below one planar surface thereof, a heavily doped drain zone of the first conductivity type in said substrate spaced from the source zone immediately below said one surface, a lightly doped third zone of said first impurity type in said substrate extending between said source and drain zones and extending deeper in said substrate than either said source or drain zones, a thin buried zone of the second conductivity type in said substrate spaced below and around the ends of said source zone, the region of said buried zone where it lies between said source and drain zones providing a channel whose length is only the thickness of the buried zone in the region where the buried zone reaches the substrate surface.

* * * * *